(12) United States Patent
Flynn et al.

(10) Patent No.: US 6,630,869 B2
(45) Date of Patent: Oct. 7, 2003

(54) VERY LOW PHASE NOISE TEMPERATURE STABLE VOLTAGE CONTROLLED OSCILLATOR

(75) Inventors: Sean Patrick Flynn, Long Beach, CA (US); Ronald James Tirado, Redondo Beach, CA (US); Ying Shen, Torrance, CA (US)

(73) Assignee: Harris Corporation, Melbourne, FL (US)

( * ) Notice: Subject to any disclaimer, the term of this patent is extended or adjusted under 35 U.S.C. 154(b) by 114 days.

(21) Appl. No.: 09/891,390

(22) Filed: Jun. 27, 2001

(65) Prior Publication Data

US 2003/0169117 A1 Sep. 11, 2003

(51) Int. Cl.[7] .................................................. G01J 5/00
(52) U.S. Cl. .............................................. 331/66; 68/69
(58) Field of Search ........................ 331/66, 68, 107 R, 331/116 R, 65, 158, 176, 69

(56) References Cited

U.S. PATENT DOCUMENTS

| | | | |
|---|---|---|---|
| 4,544,876 A | | 10/1985 | Bailey et al. |
| 4,667,171 A | | 5/1987 | Matthys |
| 5,450,046 A | * | 9/1995 | Kosugi et al. ............... 333/246 |
| 5,870,004 A | | 2/1999 | Lu |
| 5,890,051 A | * | 3/1999 | Schlang et al. ............... 455/76 |
| 5,896,068 A | | 4/1999 | Moyal |
| 5,940,786 A | | 8/1999 | Steeby |
| 5,983,646 A | | 11/1999 | Grothe et al. |
| 6,049,256 A | * | 4/2000 | Fry .............................. 331/69 |
| 6,060,692 A | * | 5/2000 | Bartley et al. ............... 219/210 |
| 6,075,829 A | * | 6/2000 | Hayashi et al. ............. 375/344 |
| 6,147,565 A | * | 11/2000 | Satoh et al. .................. 331/70 |

\* cited by examiner

Primary Examiner—Robert Pascal
Assistant Examiner—Dean Takaoka
(74) Attorney, Agent, or Firm—Duane Morris LLP

(57) ABSTRACT

A broadband, very low phase noise, temperature stable, sync loss free voltage controlled oscillator ("VCO circuit") is described. One use of the invention would be in a radio receiver for receiving phase modulated signals from a remote transmitter.

In one embodiment of the invention, the VCO circuit is disposed on a printed wiring board ("PWB") spaced apart from the PWB on which the synthesizer circuit is disposed. The VCO circuit may comprise a resonator, a voltage controlled oscillator, a varactor, and one or more buffer amplifiers. Additionally, a positive temperature coefficient resistive heating element ("PTC") may be included. In a preferred embodiment, the resonator, voltage controlled oscillator, varactor, and buffer amplifiers may be disposed on one side of the PWB and the PTC may be disposed on the other side of the PWB. Blind vias in the PWB enhance heat transfer from the PTC to the circuit elements on the other side of the PWB. The PWB may be encased in a thermal insulator.

37 Claims, 3 Drawing Sheets

VERY LOW PHASE NOISE TEMPERATURE STABLE VOLTAGE CONTROLLED OSCILLATOR

BACKGROUND OF THE INVENTION

A continuing problem with the transmission of digital information over a wireless communication system is the maintenance of relatively high quality, i.e., error-free, transmission. A quantity used in the art as an indicator of the quality of a transmitted bit stream is the bit error rate ("BER") of the bit stream at the receiver. The BER is a measure of the number of bit errors encountered for a given number of bits. A typical BER for a wireless communication system is on the order of $10^{-6}$, or 1 bit error per million bits transmitted.

The BER of a given wireless transmission path is determined by a number of factors. One of those factors relates to the effects of temperature changes on the receiver circuitry, specifically the synthesizer and/or oscillator circuits. The synthesizer circuit typically consists of a phase lock loop, including a loop filter, a phase detector, a voltage controlled oscillator circuit ("VCO circuit") including an oscillator, a resonator, inductors, capacitors, means for tuning the oscillator such as a varactor, and various amplifiers. As used herein, unless otherwise indicated, the synthesizer is used to refer to the phase lock loop circuitry without the VCO circuitry. The performance of some or all of these circuits exhibit some degree of temperature sensitivity. For hand-held radio receivers that are power limited, the temperature problem is typically due to heat loss since power for heaters is limited. For temperature changes that result in gradual changes in frequency at the receiver, the phase lock loop generally operates to maintain the receiver locked on to the signal frequency. For temperature changes that result in a step event, i.e., a sudden change in an operating parameter of the synthesizer and/or oscillator circuits that results in a sudden shift in frequency or phase, the BER suddenly increases until the phase lock loop can operate to mitigate the step event. This effect is exacerbated when the receiver operates in the multiplied frequency range, i.e., where the output of a relatively low frequency oscillator circuit is multiplied to achieve a higher frequency signal for transmission. Extreme temperature stability for such multiplied frequency systems is essential for error free transmission of digitally modulated data.

Previous solutions to the problem of mitigating the effects of a step event have focused on using more expensive components, either for a higher grade oscillator that is less susceptible to temperature effects or for the phase lock loop to more quickly mitigate the temperature effects to thereby minimize the loss of data and the time the BER is high after a step event. However, the prior art solutions are expensive and do not result in an appreciable decrease in data errors after a step event.

One embodiment of the present invention avoids the problems of the prior art by focusing on the temperature stability of the resonator in a broadband, very low phase noise, temperature stable, sync loss free voltage controlled oscillator. Experiments performed by the inventors show that during temperature transition periods, electro-mechanical events occur in typical VCO circuits, specifically in the resonator, that result in a step change in phase, The electromechanical events may be due to imperfections in the inductive and capacitive elements of the resonator. For instance, the layers in multi-layer capacitors may pull apart or compress together during temperature changes resulting in a sudden change in capacitance.

Embodiments of the present invention use one or more of the following techniques to minimize the step change in phase due to temperature variations of the resonator, typically temperature decreases due to heat loss. Printed microstrip inductors may be used to minimize imperfections found in inductors containing a higher volume of material. Porcelain and/or single layer capacitors may be used to minimize multi-layer capacitor effects. The resonator may be isolated on its own printed wiring board ("PWB") to obtain better thermal control. The resonator PWB may be enclosed in an insulator to minimize heat loss. The insulator may function to reflect radiated heat from the resonator PWB back to the circuitry on the resonator PWB and/or the insulator may function to minimize convective cooling due to airflow over the resonator PWB. Heaters and heat-producing circuits may also be mounted on the resonator PWB and enclosed in the insulator. An example of a heater would be a positive temperature coefficient resistive heater ("PTC heater"). The PTC heater may be mounted on the side of the resonator PWB opposite the side on which the resonator is mounted. The PTC heater may be mounted over a blind via extending substantially through the substrate of the resonator PWB Typical examples of heat-producing circuits would be buffer amplifiers, varactor, and oscillator. The number of connections between the resonator PWB and other circuitry in the receiver may be minimized to limit heat loss through electrical connections.

Accordingly, it is an object of the present invention to provide a novel broadband, very low phase noise, temperature stable, sync loss free voltage controlled oscillator.

It is another object of the present invention to provide a novel broadband, very low phase noise, temperature stable, sync loss free voltage controlled oscillator for a radio receiver operating in the millimeter frequency range.

It is yet another object of the present invention to provide a novel broadband, very low phase noise, temperature stable, sync loss free voltage controlled oscillator operating in a multiplied frequency range.

It is still another object of the present invention to provide a novel VCO circuit to minimize temperature changes of the resonator.

It is a further object of the present invention to provide a novel method of temperature enhancing the phase stability of the resonator in a VCO circuit and thereby ad enhancing the phase stability of the synthesizer.

It is yet a further object of the present invention to provide a novel method of controlling the BER of a received phase modulated signal from a remote transmitter by temperature stabilizing the resonator of the receiver.

It is still a further object of the present invention to provide a novel method of controlling the BER of a received digitally modulated signal from a remote transmitter by temperature stabilizing the resonator of the receiver.

It is an additional object of the present invention to provide a novel method of reducing occurrences of step changes in phase difference between the phase of the received signal and the phase of the output signal of the oscillator of the receiver by temperature stabilizing the resonator of the receiver.

It is yet an additional object of the present invention to provide a novel method for minimizing the heat loss from a resonator by mounting the resonator on a PWB separate from the synthesizer PWB and encapsulating the resonator PWB in an insulated enclosure.

It is still an additional object of the present invention to provide a novel method for minimizing the heat loss from a resonator by mounting the resonator on a PWB separate from the synthesizer PWB, disposing a PTC heater and heat-producing circuitry on the resonator PWB, and encapsulating the resonator PWB in an insulated enclosure.

These and many other objects and advantages of the present invention will be readily apparent to one skilled in the art to which the invention pertains from a perusal of the claims, the appended drawings, and the following detailed description of the preferred embodiments.

DESCRIPTION OF PREFERRED EMBODIMENTS

Figure 1:
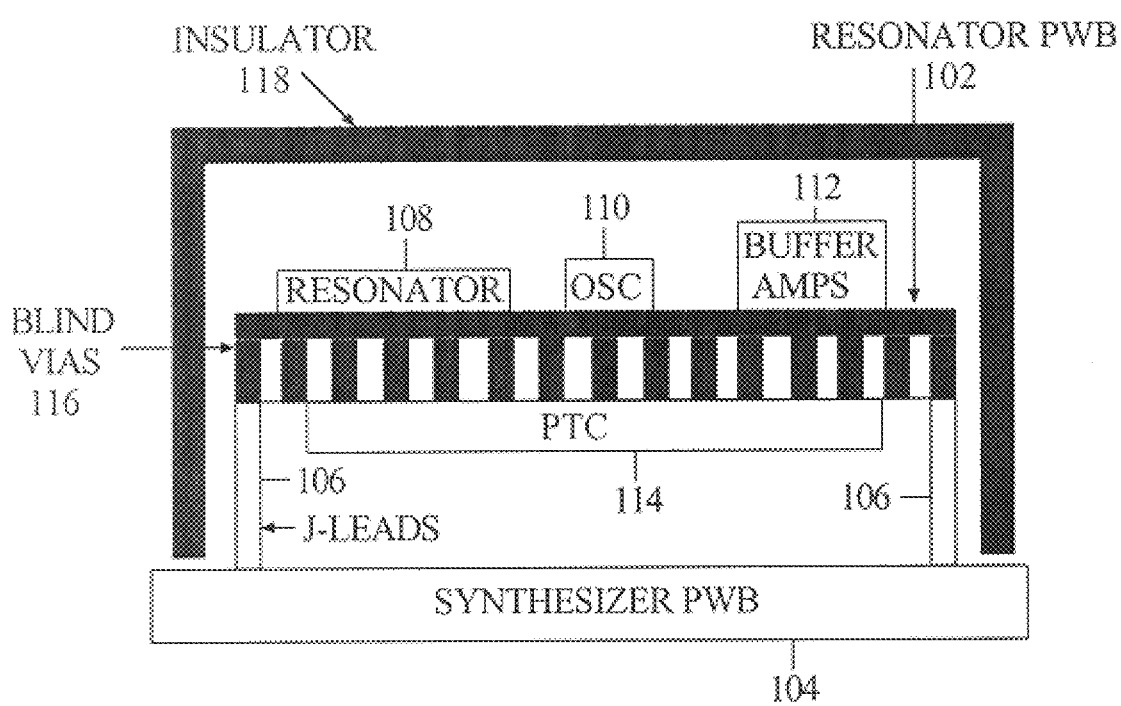
FIG. 1 is a conceptual elevation view, in partial cross section, of one embodiment of the present invention illustrating the separation of the resonator PWB from the synthesizer PWB.

The present invention is a broadband, very low phase noise, temperature stable, sync loss free voltage controlled oscillator. One use of the invention is in a hand-held radio receiver for receiving phase modulated signals from a remote transmitter, although other uses are likewise contemplated.

A typical radio receiver comprises a single PWB containing the synthesizer and VCO circuits. The synthesizer circuit typically consists of a phase lock loop, including a loop filter, a phase detector, a VCO circuit including an oscillator, a resonator, inductors, capacitors, means for tuning the oscillator such as a varactor, and various amplifier circuits. In order to maintain an acceptable bit error rate, temperature stability and the attendant phase stability of the entire synthesizer circuit due to minimization of step changes in phase, must be maintained in ones of the various components in the synthesizer circuit mention above. One embodiment of the present invention focuses on maintaining the temperature of the resonator and therefore the phase stability of the resonator. Specifically, protecting the resonator from decreases in temperature and attendant increases in instantaneous BER due to a step change in phase prior to correction of the situation by other components of the receiver. This is particularly important maintaining synchronization with a received phase modulated signal. It should be understood that the present invention will operate on any type of modulated signal received. It is impractical in a hand-held device to simply include a heater element for the device due to power and weight considerations. One embodiment of the present invention achieves the goals of minimizing BER due to thermal instability by isolating the components that most require temperature stability on a separate PWB, adding additional circuitry to provide heat, as well as encapsulating the separate PWB in an insulator. By maintaining temperature stability of the resonator With reference to FIG. 1, the resonator PWB 102 is disposed above the synthesizer PWB 104 by the J-leads 106. Only two J-leads in the foreground are shown for clarity. There typically are J-leads on the other side of the resonator PWB, one directly behind each of the two J-leads shown, for mechanical stability, shock absorption, thermal isolation from the synthesizer PWB, and for supplying electrical power to the resonator PWB. One embodiment of the present invention contemplates six J-leads, although any number of J-leads may be used. The number of J-leads to be used is determined by the expected environment that the device will encounter and a trade-off between the various functions the J-leads provide.

Electrical circuits for the resonator 108, the oscillator 110, and the buffer amplifiers 112 are shown in block diagram form disposed on the upper surface of the resonator PWB and are operatively connected by typical electrical connection means. In one preferred embodiment of the present invention, the circuitry on the upper surface of the resonator PWB comprises a Colpitts oscillator using a printed microstrip for the high Q inductive element, very high Q porcelain capacitors, a reverse biased varactor diode for tuning, and a buffer circuit optimized for the fundamental frequency range of the oscillator.

The resonator PWB may include one or more blind vias 116 which extend from the lower surface of the substrate of the resonator PWB substantially through the substrate of the resonator PWB. The blind vias may be oriented in any direction and may be of any number. A positive temperature coefficient resistor ("PTC heater") is disposed on the lower surface of the resonator PWB. The PTC heater may span one or more of the blind vias 116 which operate as heat pipes for funneling heat from the PTC heater to the circuitry on the upper surface of the resonator PWB. The resistive properties of the PTC heater vary directly with the temperature of the PTC heater. When the PTC heater cools, the DC resistance decreases thereby increases the amount of current through the PTC heater which causes an increase in the amount of heat generated by the PTC heater. When the PTC heater warms, the DC resistance increases thereby decreasing the amount of current through the PTC heater which causes a decrease in the amount of heat generated by the PTC heater. The PTC heater may receive power from a source not on the resonator PWB.

The blind vias 116 reduce the amount of substrate material in the resonator PWB 102 between the PTC heater 114 and the resonator 108 thereby increasing the heat transfer characteristics of the resonator PWB. This allows for more efficient heat flow from the PTC heater to the resonator and other circuits on the upper surface of the resonator PWB thereby decreasing the amount of power required to be drawn by the PTC heater. It is contemplated that the invention may include no modifications to the resonator substrate, such as blind vias.

An insulator 118 may be positioned around the resonator PWB to limit heat transfer to or from the resonator PWB. One embodiment of the present invention contemplates the use of styrofoam as the insulator, although it should be understood that the invention is not limited to the use of styrofoam. The insulator can be held in place by any practical means such as being glued or bonded in place by any standard means. One embodiment of the present invention contemplates the use of an enclosure over the resonator PWB and synthesizer PWB structure. The enclosure preferably includes a cavity for receiving the insulator thereby holding the insulator in place. The enclosure is not shown in the drawings for clarity.

Figure 2:
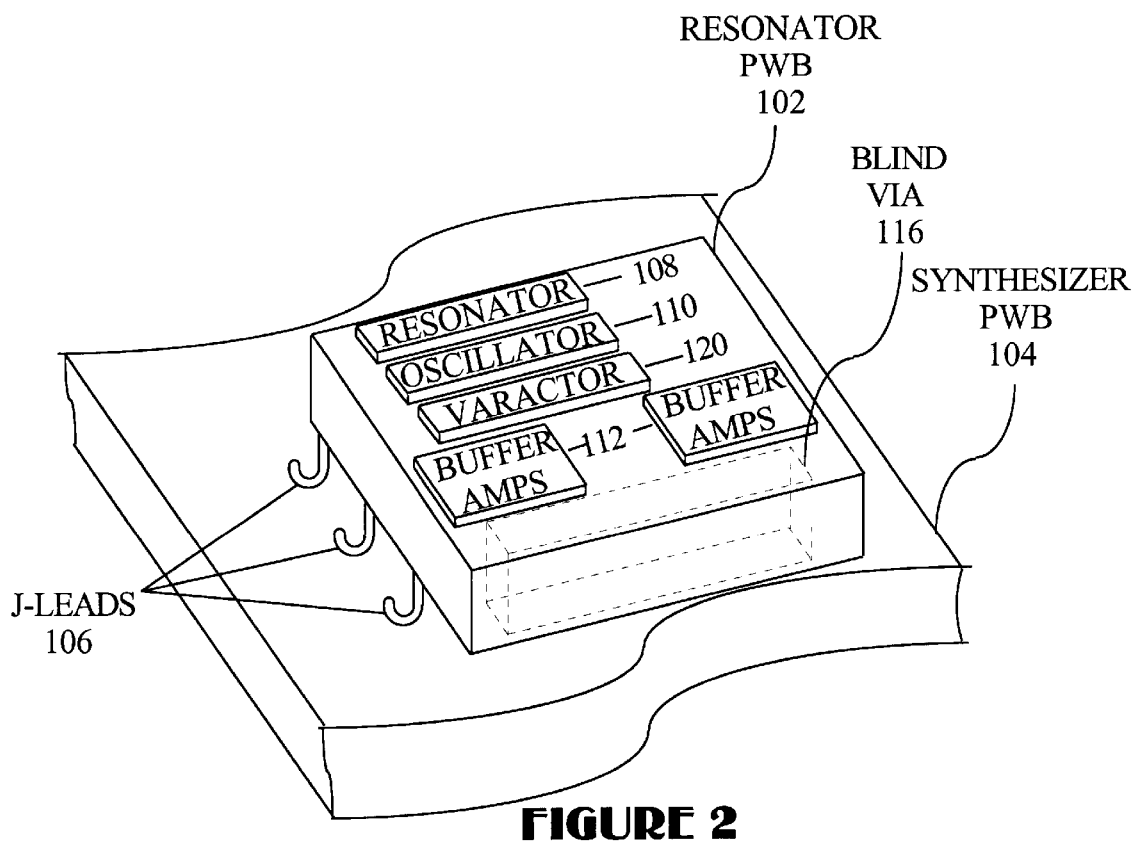
FIG. 2 is a conceptual isometric view of one embodiment of the present invention illustrating the circuitry on the top of the resonator PWB and the standoffs between the resonator PWB and the synthesizer PWB.

With reference to FIG. 2, where like components have like numbers with similar components in FIG. 1, a more detailed view of the upper surface of the resonator PWB is presented. Included in this view of the upper surface of the resonator PWB is a varactor 120 and two buffer amplifiers 112. Also depicted is one blind via 116. The insulator, PTC heater, and only one blind via are shown for clarity. It is to be understood that the blind via preferably would be beneath the resonator 108. J-leads 106 are shown on one side of the resonator PWB. As described above, there typically are J-leads on the other side of the resonator PWB, one directly behind each of the three J-leads shown.

One of the largest heat loss paths is through an electrical ground connection. At least one of the J-leads acts as an electrical ground connection for the resonator PWB. However, due to the small cross-section of a typical J-lead, heat loss to the electrical ground in minimized. The remaining J-leads may or may not carry electrical current to or from the resonator PWB. The J-leads are attached to the resonator PWB and the synthesizer PWB by standard methods known in the art. In one embodiment of the present invention, only one J-lead is soldered to the synthesizer PWB thereby maximizing the thermal isolation of the resonator PWB from the synthesizer PWB.

As discussed above, one of the problems in the prior art which the present invention solves is the heat loss from the resonator. Heat generating circuits, such as the buffer amplifiers and the oscillator, are included on the resonator PWB to maintain the temperature stability of the resonator without wasting power on additional heating circuits.

Figure 3:
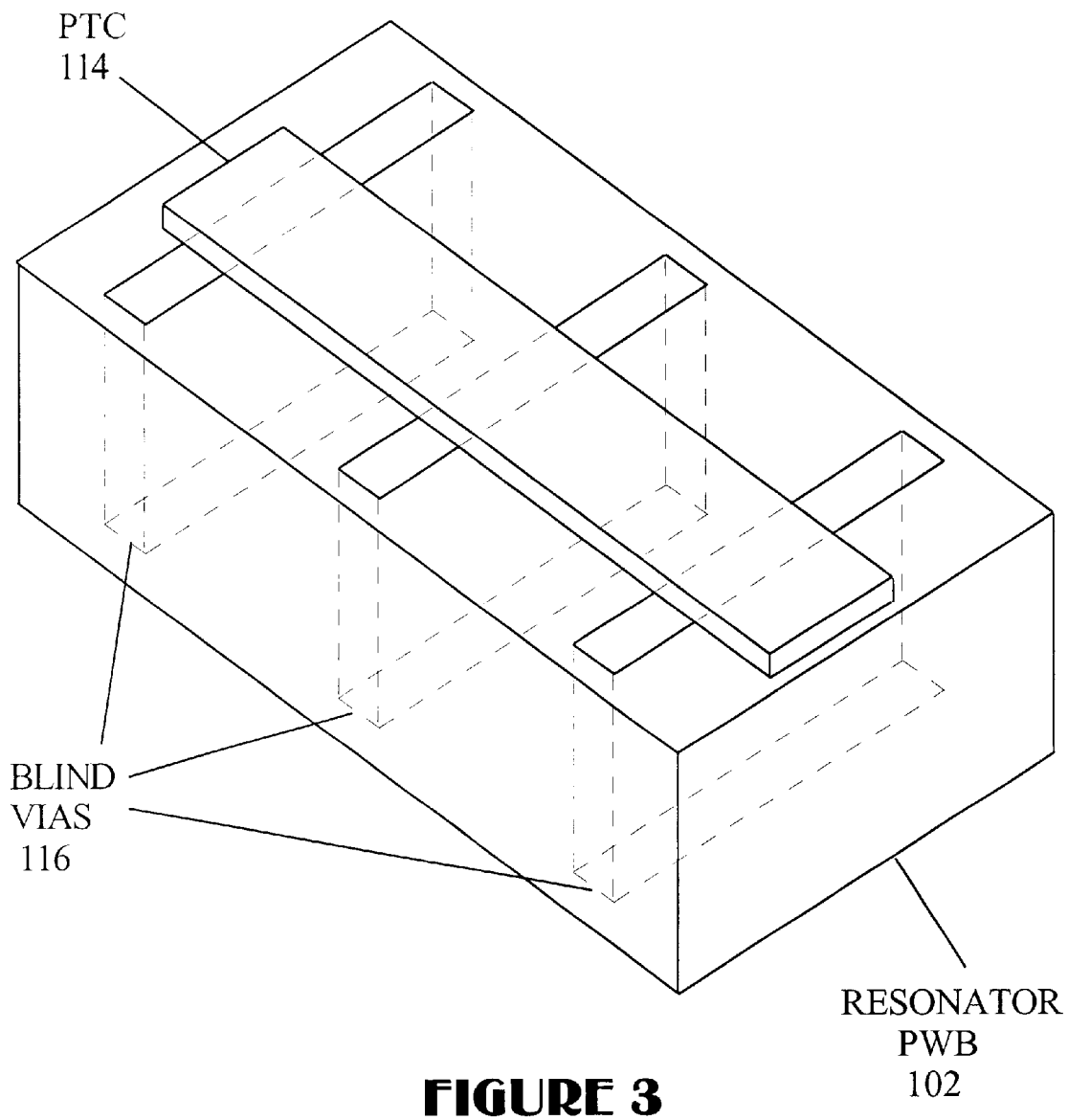
FIG. 3 is a conceptual isometric view of one embodiment of the present invention illustrating the circuitry on the bottom of the resonator PWB and the blind vias in the resonator PWB.

With reference to FIG. 3, where like components have like numbers with similar components in FIGS. 1 and 2, a more detailed view of the lower surface of the resonator PWB is presented. Three blind vias 116 are depicted in the resonator PWB 102, along with a PTC heater 114. This figure shows a contemplated relationship of the PTC heater to the blind vias. As discussed above, the present invention is not limited to three blind vias in the resonator PWB. Use of plural PTC heaters is also contemplated. In one embodiment of the present invention, neither PTC heaters or blind vias are contemplated where temperature stability of the resonator can be maintained with the heat radiated by the oscillator, amplifiers, and other circuitry that may be placed on the resonator PWB.

While preferred embodiments of the present invention have been described, it is to be understood that the embodiments described are illustrative only and the scope of the invention is to be defined solely by the appended claims when accorded a full range of equivalence, many variations and modifications naturally occurring to those of skill in the art from a perusal hereof.

What is claimed is:

1. A broadband, very low phase noise, temperature stable, sync loss free voltage controlled oscillator circuit ("VCO circuit") comprising:
    (a) a first printed wiring board ("PWB") comprising a synthesizer circuit;
    (b) a second PWB having first and second surfaces and at least one unplated blind via open to the second surface and penetrating substantially through the second PWB towards the first surface to allow for heat transfer between the surfaces, comprising:
        (i) a Clapp oscillator on said first surface comprising:
            (1) a printed microstrip as a high Q inductive element;
            (2) plural very high Q porcelain capacitors; and
            (3) a reversed biased varactor diode for tuning the oscillator;
        (ii) a buffer amplifier circuit on said first surface optimized for the fundamental frequency range of the oscillator; and
        (iii) a positive temperature coefficient resistor on said second surface operatively connected to a DC voltage source not on said second surface;
    (c) plural supports, each capable of carrying an electric current, connected to the second PWB and extending towards the first PWB to thereby space apart the PWBs; and
    (d) an insulated enclosure around said second PWB to minimize heat loss from said second PWB thereby allowing the VCO circuit to function in a broadband, very low phase noise, temperature stable, sync loss free manner.

2. The VCO circuit of claim 1 wherein said positive temperature coefficient resistor spans the opening of at least one blind via.

3. The VCO circuit of claim 1 wherein said plural supports are J-lead pins.

4. The VCO circuit of claim 3 wherein said plural supports are six in number.

5. The VCO circuit of claim 1 wherein less than all of said plural supports are electrically connected to the first PWB.

6. The VCO circuit of claim 1 wherein said insulator contains styrofoam.

7. A voltage controlled oscillator circuit comprising:
    an insulative housing;
    a substrate mounted within said housing, said substrate having a plurality of blind vias normal to the plane thereof;
    a circuit carried by one surface of said substrate, said circuit including a resonator comprising a microstrip inductor and plural porcelain capacitors;
    a positive temperature coefficient resistive heating element carried by the other surface of said substrate; and
    means adapted to supplying power to said heating element from a source external of said housing.

8. The voltage controlled oscillator circuit of claim 7 wherein said blind vias are open to said other surface of the substrate and penetrate substantially through the substrate the said one surface of the substrate, and
    wherein said positive temperature coefficient resistor spans the opening of at least one of the plurality of blind vias.

9. The voltage controlled oscillator circuit of claim 7 wherein said insulative housing contains styrofoam.

10. A method of temperature enhancing the phase stability of the synthesizer circuit of a radio by mounting the resonator portion of said synthesizer circuit on a substrate other than the substrate of said synthesizer, enclosing the substrate of said resonator portion in an insulated enclosure spaced from the substrate of said synthesizer by a plurality of electrically conductive standoffs,
    the substrate of said resonator portion having a plurality of blind vias normal to the plane of the substrate of the said resonator portion and a positive temperature coefficient resistive heating element powered from a source external of said enclosure to thereby influence the temperature within said enclosure,
    some but less than all of said standoffs providing an electrical connection between said resonator portion and synthesizer.

11. The method of claim 10 where said radio operates in the millimeter frequency range, and wherein the frequency of the output signal from said oscillator portion is approximately 1 GHz.

12. The method of claim 10 wherein said positive temperature coefficient resistive heating element spans the opening of at least one blind via.

13. The method of claim 10 wherein said plural standoffs are J-lead pins.

14. The method of claim 13 wherein said plural supports are six in number.

15. The method of claim 10 wherein said insulated enclosure contains styrofoam.

16. In a radio receiver for receiving phase modulated signals from a remote transmitter, said radio receiver including the combination of a phase lock loop and a voltage controlled oscillator circuit containing a resonator for maintaining synchronization of the radio receiver with the remote transmitter, the method comprising the step of controlling the bit error rate of the received signal by temperature stabilizing the resonator.

17. The method of claim 16 including the additional step of enclosing said resonator in an insulative housing.

18. The method of claim 17 including the additional step of disposing a positive temperature coefficient resistor within said insulative housing, said resistor operatively connected to a power source not contained within said insulative housing.

19. The method of claim 18 wherein said insulative housing contains foam.

20. The method of claim 17 including the additional step of disposing heat-generating circuitry within said insulative housing.

21. The method of claim 20 wherein said heat-generating circuitry includes a buffer amplifier.

22. The method of claim 20 wherein said heat-generating circuitry includes a phase detector.

23. The method of claim 20 wherein said heat-generating circuitry includes a loop filter for said phase lock loop.

24. In a radio receiver for receiving phase modulated signals from a remote transmitter, said radio receiver including the combination of a phase lock loop and a voltage controlled oscillator circuit containing a resonator for maintaining synchronization of the radio receiver with the remote transmitter, the method comprising the step of reducing the occurrence of a step change in the phase difference between the phase of the received signal and the phase of the output signal of the oscillator by temperature stabilizing the resonator.

25. The method of claim 24 including the additional step of enclosing said resonator in an insulative housing.

26. The method of claim 25 including the additional step of disposing a positive temperature coefficient resistor within said insulative housing, said resistor operatively connected to a power source not contained within said insulative housing.

27. The method of claim 26 wherein said insulative housing contains styrofoam.

28. The method of claim 25 including the additional step of disposing heat-generating circuitry within said insulative housing.

29. The method of claim 28 wherein said heat-generating circuitry includes a buffer amplifier.

30. The method of claim 28 wherein said heat-generating circuitry includes a phase detector.

31. The method of claim 28 wherein said heat-generating circuitry includes a loop filter for said phase lock loop.

32. In a radio receiver for receiving phase modulated signals from a remote transmitter, said radio receiver including a synthesizer on a printed wiring board ("PWB") comprised of the combination of a phase lock loop and a voltage controlled oscillator circuit containing a resonator, said synthesizer for maintaining synchronization of the radio receiver with the remote transmitter, the improvement including the step of disposing the resonator and heat-generating circuitry on a second PWB separate from the synthesizer PWB and encapsulating said second PWB in an insulated enclosure to thereby temperature stabilize the resonator.

33. The method of claim 32 including the additional step of disposing a positive temperature coefficient resistor within said insulated enclosure, said resistor operatively connected to a power source not contained within said insulated enclosure.

34. The method of claim 32 wherein said insulated enclosure contains styrofoam.

35. The method of claim 32 wherein said heat-generating circuitry includes a buffer amplifier.

36. The method of claim 32 wherein said heat-generating circuitry includes a phase detector.

37. The method of claim 32 wherein said heat-generating circuitry includes a loop filter for said phase lock loop.

* * * * *